United States Patent
Onyshchenko et al.

(10) Patent No.: US 12,408,257 B2
(45) Date of Patent: Sep. 2, 2025

(54) DEVICE AND METHOD FOR GENERATING A PLASMA JET

(71) Applicant: UNIVERSITEIT GENT, Ghent (BE)

(72) Inventors: Yuliia Onyshchenko, Zwijnaarde (BE); Mehrnoush Narimisa, Heusden (BE); Nathalie De Geyter, Langemark (BE); Rino Morent, Langemark (BE)

(73) Assignee: UNIVERSITEIT GENT, Ghent (BE)

( * ) Notice: Subject to any disclaimer, the term of this patent is extended or adjusted under 35 U.S.C. 154(b) by 0 days.

(21) Appl. No.: 18/553,715

(22) PCT Filed: Mar. 28, 2022

(86) PCT No.: PCT/EP2022/058144
§ 371 (c)(1),
(2) Date: Oct. 2, 2023

(87) PCT Pub. No.: WO2022/207563
PCT Pub. Date: Oct. 6, 2022

(65) Prior Publication Data
US 2024/0188208 A1    Jun. 6, 2024

(30) Foreign Application Priority Data
Apr. 1, 2021   (EP) .................................... 21166684

(51) Int. Cl.
*H05H 1/46* (2006.01)
*H01J 37/32* (2006.01)
*B05D 1/00* (2006.01)

(52) U.S. Cl.
CPC ....... *H05H 1/466* (2021.05); *H01J 37/32091* (2013.01); *H01J 37/3244* (2013.01); *B05D 1/62* (2013.01); *H01J 2237/3382* (2013.01)

(58) Field of Classification Search
CPC ................ H05H 1/466; H01J 37/32091; H01J 37/3244; H01J 2237/3382; B05D 1/62
See application file for complete search history.

(56) References Cited

U.S. PATENT DOCUMENTS 8,883,027 B2 * 11/2014 Yoon .................. H01L 21/67069
156/345.43
8,926,789 B2 * 1/2015 Yoon .................. H01L 21/02087
156/345.31

(Continued)

FOREIGN PATENT DOCUMENTS

EP   2320715 A2   5/2011
EP   3586954 A1   7/2023

(Continued)

OTHER PUBLICATIONS

European Search Report and Written Opinion for EP21166684.7 dated Sep. 15, 2021, 8 pages.

(Continued)

*Primary Examiner* — Adam D Houston
(74) *Attorney, Agent, or Firm* — Dickinson Wright PLLC

(57) ABSTRACT

A device for generating a plasma jet is disclosed. A nozzle of the device comprises an inner, middle and outer channel surrounding each other and electrically insulated from each other. The device is configured for flowing through the inner, middle and outer channel respectively a first ignitable gas, a monomer precursor and a second ignitable gas towards their respective exit openings. A high voltage electrode is arranged in the inner channel for generating a plasma from the first ignitable gas. The nozzle further comprises a nozzle cap enclosing a mixing volume after the exit openings of the inner, middle and outer channel. The nozzle cap is provided with an exit opening after the mixing volume, which exit opening is smaller than the exit opening of the outer channel.

22 Claims, 6 Drawing Sheets

(56) References Cited

U.S. PATENT DOCUMENTS

| | | | | |
|---|---|---|---|---|
| 11,810,756 B2* | 11/2023 | Yancey | ................... | B44D 3/16 |
| 2011/0121107 A1 | 5/2011 | Siffer et al. | | |
| 2012/0100300 A1* | 4/2012 | Gindrat | ............... | H05H 1/3405 |
| | | | | 427/446 |
| 2014/0120731 A1 | 5/2014 | Xu et al. | | |
| 2017/0243727 A1* | 8/2017 | Poenitzsch | ............. | B05B 7/224 |
| 2017/0338084 A1* | 11/2017 | Nishijima | ........... | H01J 37/3255 |
| 2018/0047595 A1* | 2/2018 | Kofuji | ............... | H01J 37/32357 |
| 2020/0098651 A1* | 3/2020 | Sakiyama | ............... | C23C 16/50 |
| 2022/0339373 A1* | 10/2022 | De Geyter | ........... | H05H 1/2443 |
| 2024/0188208 A1* | 6/2024 | Onyshchenko | ... | H01J 37/32091 |

FOREIGN PATENT DOCUMENTS

| | | | | |
|---|---|---|---|---|
| KR | 20110049983 A | 5/2011 | | |
| WO | 2009036579 A1 | 3/2009 | | |
| WO | WO-2014191012 A1 * | 12/2014 | ........... | H05H 1/2406 |
| WO | 2018141802 A1 | 8/2018 | | |

OTHER PUBLICATIONS

International Search Report and Written Opinion for PCT/EP2022/058144 dated Jul. 26, 2022, 12 pages.

* cited by examiner

DEVICE AND METHOD FOR GENERATING A PLASMA JET

CROSS-REFERENCE TO RELATED APPLICATIONS

This is a National Stage Application, filed under 35 U.S.C. 371 based on International Patent Application No. PCT/EP2022/058144, filed Mar. 28, 2022, which claims priority to EP Patent Application Ser. No. 21/166,684.7 filed Apr. 1, 2021, the disclosures of which are incorporated herein by reference in their entireties.

TECHNICAL FIELD

The present invention relates to a device and a method for generating a plasma jet, preferably for plasma polymerisation or plasma activation.

BACKGROUND ART

Devices for generating a plasma jet are known from the prior art, for example from WO 2018/141802 A1 or EP 3 586 954 A1. Such a device comprises a nozzle through which plasma is ejected in the form of a jet. The nozzle comprises a first channel, and the device is configured for flowing an ignitable gas, suitable to generate a plasma therefrom, through the first channel towards an exit opening of the nozzle. A high voltage electrode is arranged in the first channel for generating a plasma from the ignitable gas flowing in the first channel. The device is further provided for mixing a monomer precursor with the ignitable gas or the plasma generated therefrom in the first channel, such that the monomer precursor can be polymerised in the generated plasma. The monomer precursor can be provided from a second channel into the first channel, but can also be provided directly into the first channel together with the ignitable gas.

Such devices for generating a plasma jet known from the prior art have the disadvantage that the monomer precursor is often not well mixed with the ignitable gas or the plasma generated therefrom, such that not all monomer precursor is effectively polymerised in the plasma jet.

DISCLOSURE OF THE INVENTION

It is an aim of the present invention to provide a device and a method for generating a plasma jet having a better mixing of a monomer precursor in the plasma jet.

This aim is achieved according to the present invention with a device and a method for generating a plasma jet showing the technical characteristics of respectively the first independent claim and the second independent claim.

Therefore, the present invention provides a device for generating a plasma jet. Preferably, the plasma jet comprises a monomer precursor. Preferably; the plasma jet is for plasma polymerisation or plasma activation, but not necessarily limited thereto. The device comprises a nozzle. The nozzle of the device comprises an inner channel. The device is configured for flowing a first ignitable gas through the inner channel towards an exit opening of the inner channel. A high voltage electrode is arranged in the inner channel for generating a plasma from the first ignitable gas flowing in the inner channel. Preferably, the high voltage electrode is arranged along the length of the inner channel. Preferably, the high voltage electrode extends up to the exit opening of the inner channel. Preferably, a pointed tip of the high voltage electrode is located at the exit opening of the inner channel. The nozzle of the device comprises a middle channel. The middle channel surrounds the inner channel. The middle channel is electrically insulated from the inner channel. The device is configured for flowing a monomer precursor through the middle channel towards an exit opening of the middle channel. The nozzle of the device comprises an outer channel. The outer channel surrounds the middle channel. The outer channel is electrically insulated from the middle channel. The device is configured for flowing a second ignitable gas through the outer channel towards an exit opening of the outer channel. Preferably, the inner channel, the middle channel and the outer channel are circular channels. Preferably, the inner channel, the middle channel and the outer channel are coaxial channels. Preferably, the exit openings of the inner channel, the middle channel and the outer channel are coplanar. The nozzle of the device comprises a nozzle cap. The nozzle cap encloses a mixing volume located after the exit openings of the inner channel, the middle channel and the outer channel. Preferably, the nozzle cap is surrounding an end portion of the outer channel, the middle channel and the inner channel. Preferably, the nozzle cap is rotationally symmetric. Preferably, the nozzle cap is coaxial with the coaxial inner channel, middle channel and outer channel. Preferably, the nozzle cap is in an electrically conducting material. Preferably, the nozzle cap is grounded. The nozzle cap is provided with an exit opening after the mixing volume. The exit opening of the nozzle cap is smaller than the exit opening of the outer channel. Preferably, the exit opening of the nozzle cap is circular. Preferably, the exit opening of the nozzle cap is arranged in front of at least the exit opening of the inner channel. Preferably, the exit opening of the nozzle cap is coaxial with the coaxial inner channel, middle channel and outer channel. Preferably, the exit opening of the nozzle cap is arranged in a plane parallel to the plane of the exit openings of the inner channel, the middle channel and the outer channel.

The nozzle cap enclosing a mixing volume after the exit openings of the inner channel, the middle channel and the outer channel, and the nozzle cap having an exit opening after the mixing volume with a size smaller than the exit opening of the outer channel, offers the advantage that the combined flow of the plasma and possible leftover first ignitable gas, the monomer precursor, and the second ignitable gas out of the exit openings of respectively the inner channel, the middle channel and the outer channel cannot pass completely through the smaller exit opening of the nozzle cap and is circulated inside the mixing volume. With this combined flow being circulated inside the mixing volume a better mixing of the monomer precursor with the plasma and/or the ignitable gases, i.e. the first ignitable gas and the second ignitable gas, is achieved. Thereby, further plasma can be generated from the ignitable gases circulated in the mixing volume by means of the high voltage electrode in the inner channel, which preferably extends up to the exit opening of the inner channel and thus up to the mixing volume.

The outer channel providing a flow of the second ignitable gas in the mixing volume, and the exit opening of the nozzle cap being smaller than the exit opening of the outer channel, offers the advantage that the flow of the second ignitable gas is directed towards the flow of the plasma and possible leftover first ignitable gas from the inner channel and the flow of the monomer precursor from the middle channel, thereby preventing these flows from directly exiting the mixing volume through the exit opening of the nozzle cap, and thereby aiding in circulating the different flows inside the mixing volume of the nozzle cap to improve the mixing of the monomer precursor with the plasma and/or the ignitable gases.

The outer channel providing a flow of the second ignitable gas in the mixing volume, and the exit opening of the nozzle cap being smaller than the exit opening of the outer channel, also offers the advantage that the flow of the second ignitable gas is guided along an inner wall of the nozzle cap enclosing the mixing volume towards the exit opening of the nozzle cap. This flow of the second ignitable gas shields the inner wall of the nozzle cap enclosing the mixing volume from polymerised monomer precursor in the mixing volume being deposited on said inner wall, which is undesirable since it would clog the nozzle.

In an embodiment of the device according to the present invention the mixing volume is adapted for mixing the plasma of the first ignitable gas from the inner channel, the monomer precursor from the middle channel and the second ignitable gas from the outer channel.

In an embodiment of the device according to the present invention the mixing volume is located within the nozzle cap.

In an embodiment of the device according to the present invention the mixing volume is located directly after the exit openings of the inner channel, the middle channel and the outer channel.

In an embodiment of the device according to the present invention the exit opening of the nozzle cap is located directly after the mixing volume.

In an embodiment of the device according to the present invention the mixing volume extends from the exit openings of the inner channel, the middle channel and the outer channel to the exit opening of the nozzle cap.

In an embodiment of the device according to the present invention the exit opening of the nozzle cap is smaller than or equal to the exit opening of the middle channel.

This embodiment is beneficial for fully directing the flow of the second ignitable gas out of the exit opening of the outer channel towards the flow of the plasma and possible leftover first ignitable gas from the inner channel and the flow of the monomer precursor from the middle channel, thereby further preventing these flows from directly exiting the mixing volume through the exit opening of the nozzle cap, and thereby aiding in circulating the different flows inside the mixing volume of the nozzle cap to further improve the mixing of the monomer precursor with the plasma and/or the ignitable gases.

In an embodiment of the device according to the present invention an inner wall of the nozzle cap is shaped for gradually guiding the flow of the second ignitable gas in the mixing volume from the exit opening of the outer channel towards the exit opening of the nozzle cap.

The inner wall of the nozzle cap enclosing the mixing volume being shaped as such is beneficial for maintaining a stable flow of the second ignitable gas along the inner wall of the nozzle cap towards the exit opening of the nozzle cap, which improves the shielding by the second ignitable gas of the inner wall against polymerised monomer precursor in the mixing volume being deposited on said inner wall.

In an embodiment of the device according to the present invention the inner wall of the nozzle cap is funnel shaped for gradually guiding the flow of the second ignitable gas in the mixing volume from the exit opening of the outer channel towards the exit opening of the nozzle cap.

The inventors have found that the funnel shape of the inner wall of the nozzle cap is a very suitable shape for gradually guiding the flow of the second ignitable gas in the mixing volume from the exit opening of the outer channel towards the exit opening of the nozzle cap.

In an embodiment of the device according to the present invention the nozzle cap is arranged for being removably connected to the nozzle of the device.

This embodiment offers the advantage that the nozzle cap can be removed from the nozzle for cleaning, or for replacement with a different type of nozzle cap, for example a nozzle cap having an exit opening of a different size.

In an embodiment of the device according to the present invention the device is configured for flowing the first ignitable gas at a predetermined first flow rate through the inner channel towards the exit opening of the inner channel. In an embodiment of the device according to the present invention the first flow rate is at least 0.1 slm, preferably at least 0.2 slm, more preferably at least 0.3 slm, and even more preferably at least 0.4 slm. In an embodiment of the device according to the present invention the first flow rate is at most 0.9 slm, preferably at most 0.8 slm, more preferably at most 0.7 slm, and even more preferably at most 0.6 slm, In an embodiment of the device according to the present invention the first flow rate is most preferably 0.5 slm.

The inventors have found that with the first flow rate of the first ignitable gas in the inner channel, and thus also of the plasma generated from the first ignitable and possible leftover first ignitable gas entering the mixing volume, being in the given range, a uniform mixing of the monomer precursor with the plasma and the ignitable gases inside the mixing volume is achieved.

In an embodiment of the device according to the present invention the device is configured for flowing the monomer precursor at a predetermined second flow rate through the middle channel towards the exit opening of the middle channel. In an embodiment of the device according to the present invention the second flow rate is at least 50 sccm, preferably at least 100 sccm, more preferably at least 150 sccm, and even more preferably at least 200 sccm. In an embodiment of the device according to the present invention the second flow rate is at most 650 sccm, preferably at most 550 sccm, more preferably at most 450 sccm, and even more preferably at most 350 sccm. In an embodiment of the device according to the present invention the second flow rate is most preferably 250 sccm.

The inventors have found that with the second flow rate of the monomer precursor in the middle channel, and thus also of the monomer precursor entering the mixing volume, being in the given range, a uniform mixing of the monomer precursor with the plasma and the ignitable gases inside the mixing volume is achieved.

In an embodiment of the device according to the present invention the device is configured for flowing a carbon based monomer precursor through the middle channel towards the exit opening of the middle channel. The carbon based monomer precursor is for example styrene or methyl methacrylate, MMA.

In an embodiment of the device according to the present invention the device is configured for flowing the second ignitable gas at a predetermined third flow rate through the outer channel towards the exit opening of the outer channel. In an embodiment of the device according to the present invention the third flow rate is at least 0.2 slm, preferably at least 0.4 slm, more preferably at least 0.6 slm, and even more preferably at least 0.8 slm. In an embodiment of the device according to the present invention the third flow rate is at most 5 slm, preferably at most 4 slm, more preferably at most 3 slm, and even more preferably at most 2 slm. In an embodiment of the device according to the present invention the third flow rate is most preferably 1 slm.

The inventors have found that with the third flow rate of the second ignitable gas in the outer channel, and thus also of the second ignitable gas entering the mixing volume, being in the given range, a uniform mixing of the monomer precursor with the plasma and the ignitable gases inside the mixing volume is achieved.

In an embodiment of the device according to the present invention the exit opening of the nozzle cap has a diameter of at least 0.5 mm, preferably at least 1 mm, more preferably at least 1.5 mm, and even more preferably at least 2 mm. In an embodiment of the device according to the present invention the exit opening of the nozzle cap has a diameter of at most 9 mm, preferably at most 8 mm, more preferably at most 7 mm, and even more preferably at most 6 mm.

In an embodiment of the device according to the present invention the exit opening of the nozzle cap is adjustable in size. The exit opening may for example by adjustable in size by means of an iris diaphragm, such as used in a photo camera.

This embodiment offers the advantage that the size of the exit opening of the nozzle cap can easily be adapted for the use of the device according to the present invention in different applications, without having to replace the nozzle cap or making use of different devices according to the present invention having nozzle caps with exit openings of different sizes.

The present invention further provides a method for generating a plasma jet. Preferably, the plasma jet comprises a monomer precursor. Preferably; the plasma jet is for plasma polymerisation or plasma activation, but not necessarily limited thereto. The method comprises the step of flowing a first ignitable gas through an inner channel towards an exit opening of the inner channel. The method comprises the step of generating a plasma from the first ignitable gas flowing in the inner channel by means of a high voltage electrode arranged in the inner channel. The method comprises the step of flowing a monomer precursor through a middle channel towards an exit opening of the middle channel. The middle channel surrounds the inner channel. The middle channel is electrically insulated from the inner channel. The method comprises the step of flowing a second ignitable gas through an outer channel towards an exit opening of the outer channel. The outer channel surrounds the middle channel. The outer channel is electrically insulated from the middle channel. The method comprises the step of mixing the plasma of the first ignitable gas, the monomer precursor and the second ignitable gas in a mixing volume of a nozzle cap located after the exit openings of the inner channel, the middle channel and the outer channel. The method comprises the step of ejecting the mixture of the plasma of the first ignitable gas, the monomer precursor and the second ignitable gas in the mixing volume out of an exit opening of the nozzle cap located after the mixing volume. The exit opening of the nozzle cap is smaller than the exit opening of the outer channel.

In an embodiment of the method according to the present invention the first ignitable gas is flowed at a predetermined first flow rate through the inner channel towards the exit opening of the inner channel. In an embodiment of the method according to the present invention the first flow rate is at least 0.1 slm, preferably at least 0.2 slm, more preferably at least 0.3 slm, and even more preferably at least 0.4 slm. In an embodiment of the method according to the present invention the first flow rate is at most 0.9 slm, preferably at most 0.8 slm, more preferably at most 0.7 slm, and even more preferably at most 0.6 slm. In an embodiment of the method according to the present invention the first flow rate is most preferably 0.5 slm.

In an embodiment of the method according to the present invention the monomer precursor is flowed at a predetermined second flow rate through the middle channel towards the exit opening of the middle channel. In an embodiment of the method according to the present invention the second flow rate is at least 50 sccm, preferably at least 100 sccm, more preferably at least 150 sccm, and even more preferably at least 200 sccm. In an embodiment of the method according to the present invention the second flow rate is at most 650 sccm, preferably at most 550 sccm, more preferably at most 450 sccm, and even more preferably at most 350 sccm. In an embodiment of the method according to the present invention the second flow rate is most preferably 250 sccm.

In an embodiment of the method according to the present invention the second ignitable gas is flowed at a predetermined third flow rate through the outer channel towards the exit opening of the outer channel. In an embodiment of the method according to the present invention the third flow rate is at least 0.2 slm, preferably at least 0.4 slm, more preferably at least 0.6 slm, and even more preferably at least 0.8 slm. In an embodiment of the method according to the present invention the third flow rate is at most 5 slm, preferably at most 4 slm, more preferably at most 3 slm, and even more preferably at most 2 slm. In an embodiment of the method according to the present invention the third flow rate is most preferably 1 slm.

In an embodiment of the method according to the present invention the method is performed by means of the device according to the present invention.

BRIEF DESCRIPTION OF THE DRAWINGS

The invention will be further elucidated by means of the following description and the appended figures.

MODES FOR CARRYING OUT THE INVENTION

Figure 1A:
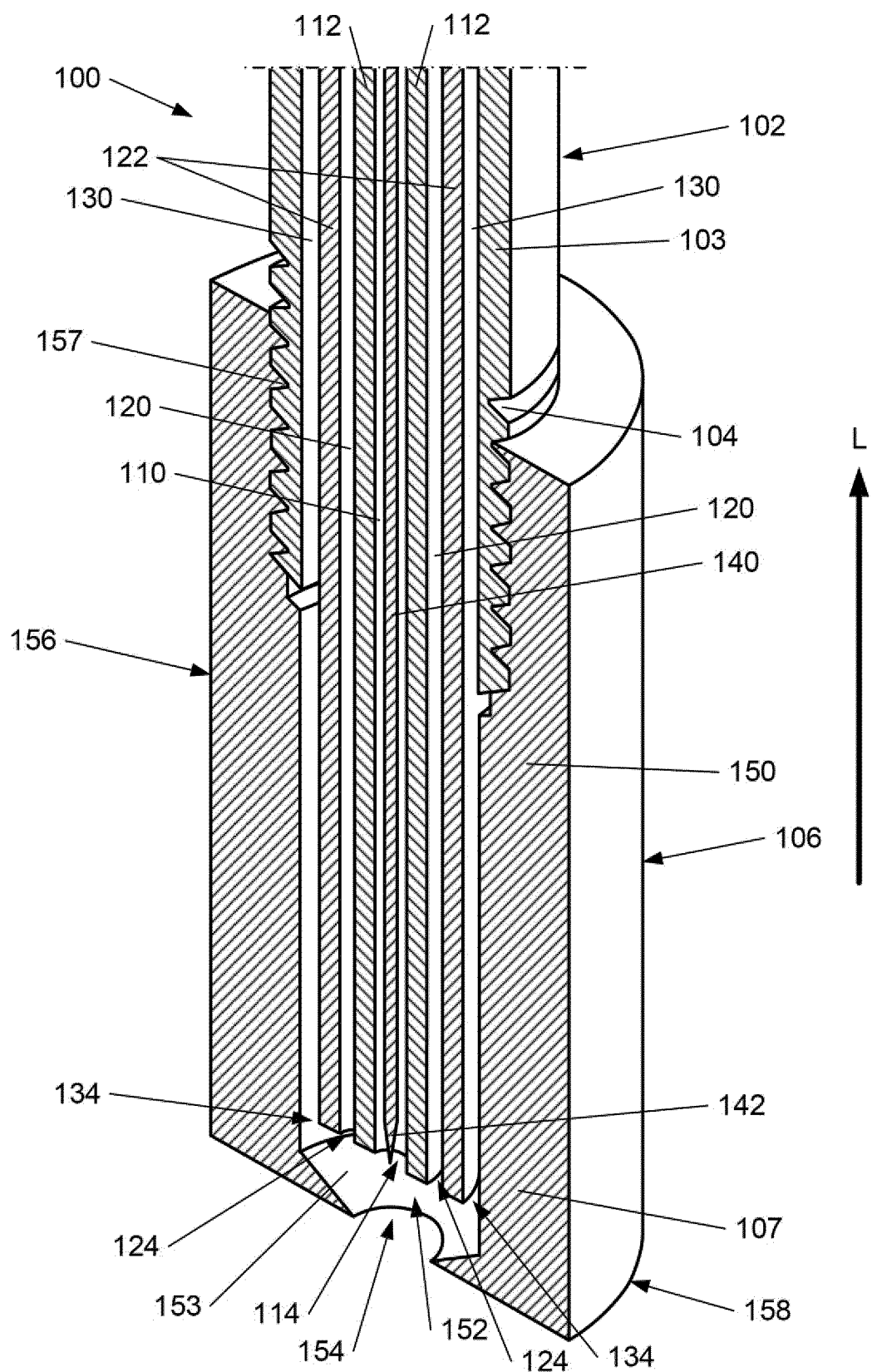
FIG. 1A shows a cutaway view of a nozzle of a device according to an embodiment of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Within the context of the present invention, the term "standard litre per minute", slm, is a unit of volumetric flow rate of a fluid in "litre per minute", l/min, at standard conditions for temperature and pressure, STP, which is defined as a temperature of 273.15 K and an absolute pressure of 101.325 kPa.

Within the context of the present invention, the term "standard cubic centimetre per minute", sccm, is a unit of volumetric flow rate of a fluid in "cubic centimetre per minute", cm3/min, at standard conditions for temperature and pressure, STP, which is defined as a temperature of 273.15 K and an absolute pressure of 101.325 kPa.

Within the context of the present invention, the term "ignitable gas" should be understood as a gas that is suitable for generating a plasma therefrom.

Figure 1B:
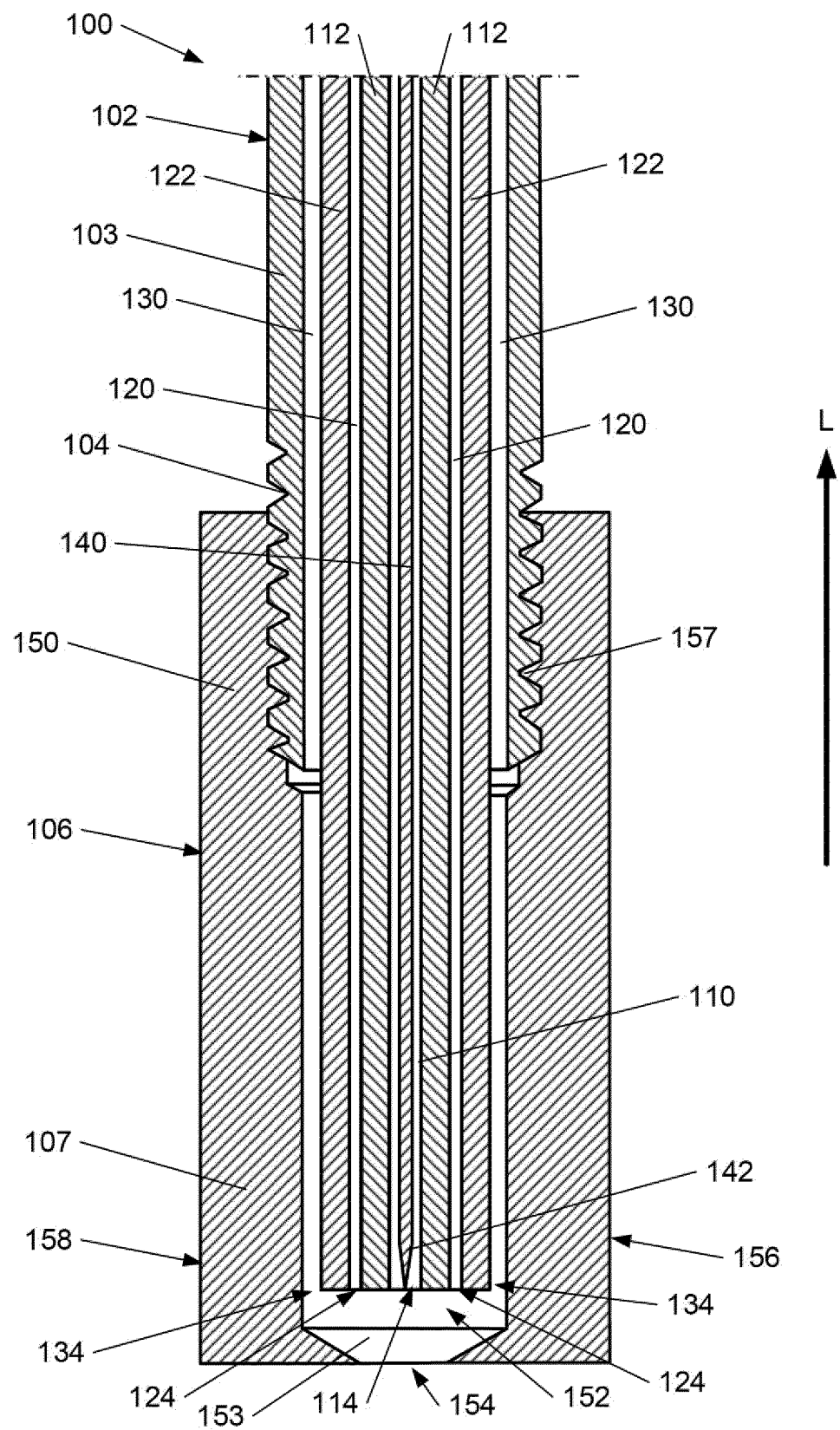
FIG. 1B shows a cross section through the nozzle of FIG. 1A.

FIGS. 1A and 1B show a nozzle 100 of a device according to the present invention for generating a plasma jet. The nozzle 100 extends along a longitudinal direction L.

The nozzle 100 comprises an inner channel 110. The inner channel 110 is formed in a first quartz capillary 112 that is arranged along the longitudinal direction L in the nozzle 100. The device is configured for flowing a first ignitable gas through the inner channel 110 towards an exit opening 114 of the inner channel 110. The first ignitable gas is a gas that is suitable for generating a plasma therefrom, such as for example He, Ar, N2 and O2, but any other suitable gas can be used. The inner channel 110 has a circular cross section and a circular exit opening 114, but any other suitable shape may be used. Within the first quartz capillary 112, and thus in the inner channel 110, there is arranged a high voltage electrode 140 for generating a plasma from the first ignitable gas flowing in the inner channel 110. The high voltage electrode 140 is a rod with a circular cross section, but any other suitable shape may be used. Preferably, the high voltage electrode 140 is used for Radio Frequency, RF, plasma generation of the first ignitable gas. The high voltage electrode 140 is needle shaped and extends along the longitudinal direction L in the inner channel 110 up to the exit opening 114 of the inner channel 110, where the high voltage electrode 140 has a pointed tip 142 for an increased electrical field strength.

The nozzle 100 also comprises a middle channel 120. The middle channel 120 is formed between a second quartz capillary 122 and the first quartz capillary 112, wherein the second quartz capillary 122 is arranged along the longitudinal direction L in the nozzle 100 and surrounds the first quartz capillary 112. The device is configured for flowing a monomer precursor through the middle channel 120 towards and exit opening 124 of the middle channel 120. The monomer precursor may be comprised in a flow of an ignitable gas. The monomer precursor may be for example styrene or methyl methacrylate, MMA, but any other suitable monomer precursor may be used depending on the application for the plasma jet, for example for plasma polymerisation or plasma activation. The middle channel 120 has a circular cross section and a circular exit opening 124, but any other suitable shape may be used, preferably corresponding to the shape of the inner channel 110 and its exit opening 114. The middle channel 120 is electrically insulated from the inner channel 110 by means of the first quartz capillary 112, to prevent plasma generation of an ignitable gas in the middle channel 120 and deposition of polymerised monomer precursor in the middle channel 120.

The nozzle 100 also comprises an outer channel 130. The outer channel 130 is formed between an outer wall 103, 107 of the nozzle 100 and the second quartz capillary 122, wherein the outer wall 103, 107 of the nozzle 100 extends along the longitudinal direction L and surrounds the second quartz capillary 122. The device is configured for flowing a second ignitable gas through the outer channel 130 towards an exit opening 134 of the outer channel 134. The second ignitable gas may be the same gas as the first ignitable gas, but the second ignitable gas can also be a gas different from the first ignitable gas. The outer channel 130 has a circular cross section and a circular exit opening 134, but any other suitable shape may be used, preferably corresponding to the shape of the inner channel 110 and the middle channel 120 and their respective exit openings 114, 124. The outer channel 130 is electrically insulated from the middle channel 120 by means of the second quartz capillary 122, to prevent plasma generation of the second ignitable gas in the outer channel 130.

The first quartz capillary 112, the second quartz capillary 122 and the outer wall 103, 107 of the nozzle 100 are coaxial, such that the inner channel 110, the middle channel 120 and the outer channel 130 are coaxial, and such that the exit openings 114, 124, 134 of the inner channel 110, the middle channel 120 and the outer channel 130, which are located in the same plane, are concentric.

The nozzle 100 also comprises a nozzle cap 150. The nozzle cap 150 extends along the longitudinal direction L. An upper portion 156 of the nozzle cap 150 forms a part of the outer wall 107 of the nozzle 100 that surrounds the outer channel 130 of the nozzle 100. A lower portion 158 of the nozzle cap 150 extends beyond the exit openings 114, 124, 134 of the inner channel 110, the middle channel 120 and the outer channel 130, and encloses there a mixing volume 152. The mixing volume 152 is located within the nozzle cap 150. At the end of the mixing volume 152 the nozzle cap 150 is provided with an exit opening 154, which is also the exit opening 154 of the nozzle 100. The mixing volume 152 is located directly after the exit openings 114, 124, 134 of the inner channel 110, the middle channel 120 and the outer channel 130, and the mixing volume 152 extends from the exit openings 114, 124, 134 of the inner channel 110, the middle channel 120 and the outer channel 130 to the exit opening 154 of the nozzle cap 150. The exit opening 154 is a circular opening, but any other suitable shape may be used, preferably a shape corresponding to the shape of the exit openings 114, 124, 134 of the inner channel 110, the middle channel 120 and the outer channel 130. The nozzle cap 150 is coaxial with the outer channel 130, the middle channel 120 and the inner channel 100, such that the exit opening 154 of the nozzle cap 154 is coaxial with the exit openings 114, 124, 134 of the inner channel 110, the middle channel 120 and the outer channel 130.

In the embodiment shown, the exit opening 154 of the nozzle cap 150 has a size which is smaller than the size of the exit opening 124 of the middle channel 120, i.e. the exit opening 154 has a circumference or outer perimeter which is smaller than, i.e. falls within, the circumference or outer perimeter of the exit opening 124 of the middle channel 120. In alternative embodiments, the size of the exit opening 154 of the nozzle cap 150 can however be smaller or larger, but is at least smaller than the size of the exit opening 134 of the outer channel 130. Preferably, the exit opening 154 of the nozzle cap 150 has a diameter of at least 0.5 mm, preferably at least 1 mm, more preferably at least 1.5 mm, even more preferably at least 2 mm, and at most 9 mm, preferably at most 8 mm, more preferably at most 7 mm, even more preferably at most 6 mm.

The inner wall 153 of the lower portion 158 of the nozzle cap 150 which encloses the mixing volume 152 is funnel shaped for gradually guiding, within the mixing volume 152, the flow of the second ignitable gas that is coming out of the exit opening 134 of the outer channel 130 towards the exit opening 154 of the nozzle cap 150, and thus directed towards the flow of the monomer precursor coming out of the exit opening 124 of the middle channel 120 and the flow of the plasma and possible leftover first ignitable gas coming out of the exit opening 114 of the inner channel 110.

The exit opening 154 of the nozzle cap 150, in this embodiment, being smaller than the exit opening 124 of the middle channel 120, and the flow of the second ignitable gas being directed within the mixing volume 152 towards the exit opening 154 of the nozzle cap 150 has the effect that the flows of the plasma and possible leftover first ignitable gas out of the inner channel 110, the monomer precursor out of the middle channel 120 and the second ignitable gas out of the outer channel 130 do not directly exit the mixing volume 152 through the exit opening 154 of the nozzle cap 150 but are circulated for a while inside the mixing volume 152. With these flows being circulated inside the mixing volume 152 of the nozzle cap 150 a better mixing of the monomer precursor with the plasma and the ignitable gases inside the mixing volume 152 is achieved, and thus in the plasma jet that is ejected out of the exit opening 154 of the nozzle cap 150. This results in a more complete polymerisation of the monomer precursor in the plasma jet.

In a preferred embodiment, to achieve an optimal mixing of the monomer precursor with the plasma and the ignitable gases inside the mixing volume 152 of the nozzle cap 150, a first flow rate of the first ignitable gas in the inner channel 110 is at least 0.1 slm, preferably at least 0.2 slm, more preferably at least 0.3 slm, even more preferably at least 0.4 slm, and at most 0.9 slm, preferably at most 0.8 slm, more preferably at most 0.7 slm, even more preferably at most 0.6 slm, and most preferably 0.5 slm. A second flow rate of the monomer precursor in the middle channel 120 is at least 50 sccm, preferably at least 100 sccm, more preferably at least 150 sccm, even more preferably at least 200 sccm, and at most 650 sccm, preferably at most 550 sccm, more preferably at most 450 sccm, even more preferably at most 350 sccm, and most preferably 250 sccm. A third flow rate of the second ignitable gas in the outer channel 130 is at least 0.2 slm, preferably at least 0.4 slm, more preferably at least 0.6 slm, even more preferably at least 0.8 slm, and/or at most 5 slm, preferably at most 4 slm, more preferably at most 3 slm, even more preferably at most 2 slm, and most preferably 1 slm.

The nozzle cap 150 is removably connected to the nozzle 100, which is beneficial for cleaning the nozzle cap 150 or for replacing the nozzle cap 150 with a different type of nozzle cap 150, for example a nozzle cap 150 having a differently sized exit opening 154. For removably connecting the nozzle cap 150 to the nozzle 100, the outer wall 103 at an upper portion 102 of the nozzle 100 is provided with an external screw thread 104 and the upper portion 156 of the nozzle cap 150 is provided with an internal screw thread 157, such that the nozzle cap 150 can be screwed onto the outer wall 103 of the upper portion 102 of the nozzle 100. It should however be clear, that the nozzle 100 and the nozzle cap 150 may also be provided with different means for removably connecting the nozzle cap 150 to the nozzle 100.

The flow of the first ignitable gas out of the inner channel 110, the monomer precursor out of the middle channel 120 and the second ignitable gas out of the outer channel 130 being circulated in the mixing volume 152 of the nozzle 100, for a more uniform distribution of the monomer precursor in the plasma jet, is demonstrated experimentally as further detailed below.

Figure 2A:
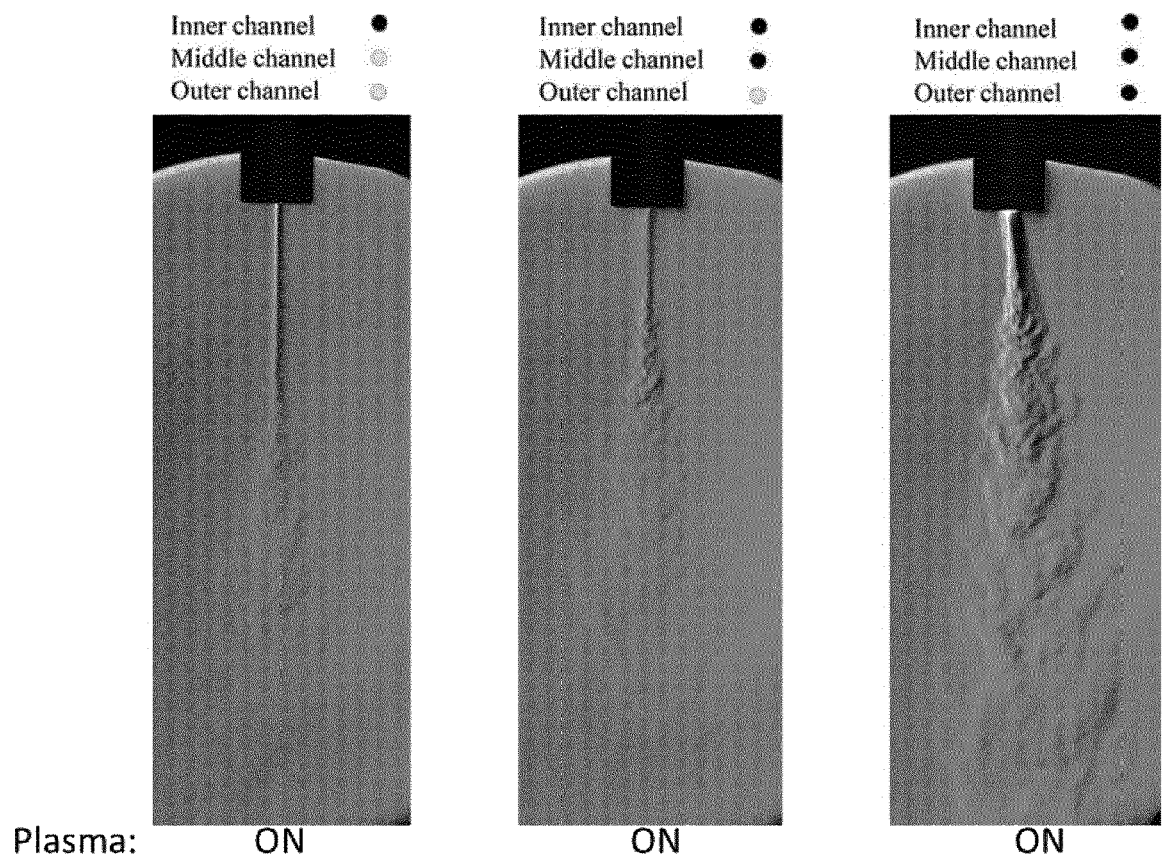
FIG. 2A shows Schlieren images of a plasma jet generated by a device according to an embodiment of the present invention with only the inner channel activated (left), with the inner and middle channel activated (middle), and with the inner, middle and outer channel activated (right) of the nozzle.

FIG. 2A shows Schlieren images of a plasma jet generated by means of a device according to an embodiment of the present invention. For this experiment a device was used with a nozzle 100 of which the mixing volume 152 has a circular exit opening 154 with a diameter of 4.5 mm. In the left image, only the inner channel 110 was active with a flow rate of argon gas, Ar, of 0.5 slm. For the middle image, the middle channel 120 was also activated, in addition to the inner channel 110, with a flow rate of Ar of 250 sccm. Here, for demonstration purposes Ar was chosen, although it is not a monomer precursor. For the right image, the outer channel 130 was also activated, in addition to the inner channel 110 and the middle channel 120, with a flow rate of Ar of 2 slm.

FIG. 2A shows that when only the inner channel 110 is in use, as shown in the left image, the plasma jet has the longest section of laminar flow regime. When the inner channel 110 and the middle channel 120 are in use, as shown in the middle image, the length of the section of laminar flow regime decreases due to the higher total flow out of the exit opening 154 of the nozzle 100. When the inner channel 110, the middle channel 120 and the outer channel 130 are all in use, the transition to turbulent regime happens at a closer distance from the exit opening 154 of the nozzle 100 as even higher total flow is passing through said exit opening 154. Moreover, in this case, the plasma jet receives additional thrust due to the mixing volume 152 in the nozzle cap 150 where the flows coming out of the inner channel 110, the middle channel 120 and the outer channel 130 circulate for a while.

Figure 2B:
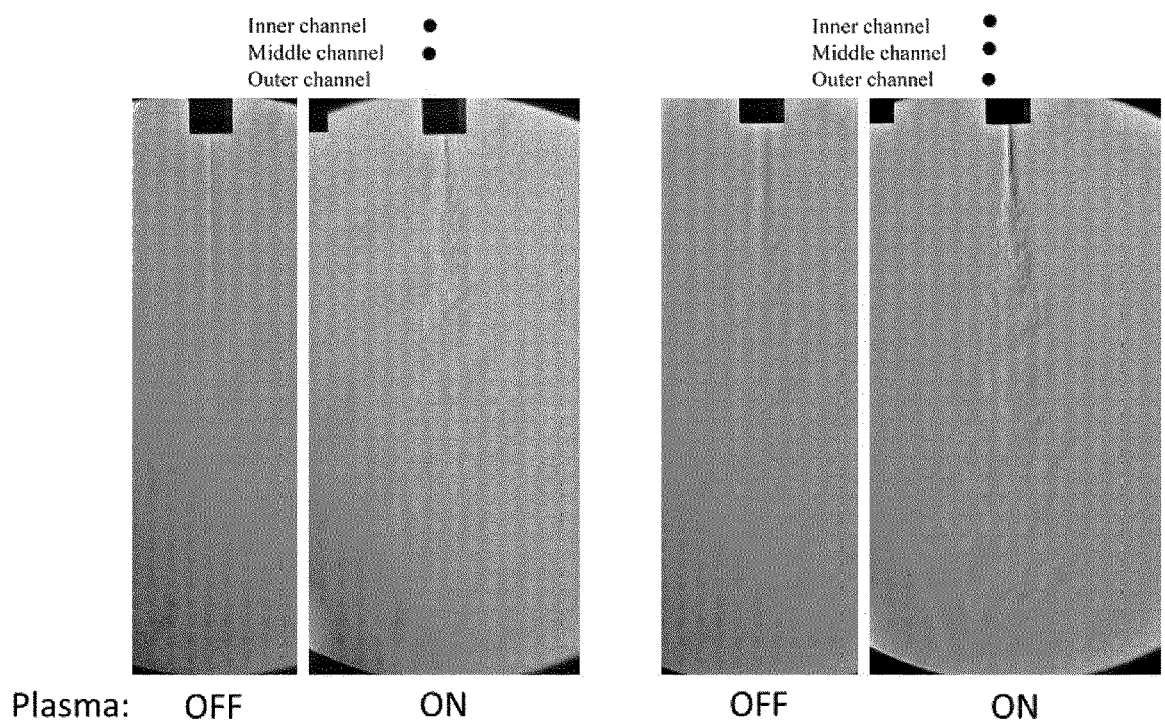
FIG. 2B shows Schlieren images of the effluent out of a device according to an embodiment of the present invention with only the inner and middle channel activated, first without the high voltage electrode activated and then with the high voltage electrode activated (two left most images), and with the inner, middle and outer channel activated, first without the high voltage electrode activated and then with the high voltage electrode activated (two right most images).

FIG. 2B shows Schlieren images of an effluent coming out of a device according to an embodiment of the present invention. For this experiment a device was used with a nozzle 100 of which the mixing volume 152 has a circular exit opening 154 with a diameter of 4.5 mm. In the left two images, the inner channel 110 was active with a flow rate of Ar of 0.5 slm and the middle channel 120 with a flow rate of Ar and styrene of 250 sccm. In the first of these two images, the high voltage electrode 140 of the device was not active, such that the effluent is merely the combination of the flows out of the inner channel 110 and the middle channel 120. In the second of these two images, the high voltage electrode 140 of the device was active, such that the effluent is a plasma jet. For the right two images, the outer channel 130 was also activated, in addition to the inner channel 110 and the middle channel 120, with a flow rate of Ar of 2 slm. In the first of these two images, the high voltage electrode 140 of the device was not active, such that the effluent is merely the combination of the flows out of the inner channel 110, the middle channel 120 and the outer channel 130. In the second of these two images, the high voltage electrode 140 of the device was active, such that the effluent is a plasma jet.

FIG. 2B shows that when only the inner channel 110 and middle channel 120 are in use, the effluent flow transits to the turbulent regime close to the exit opening 154 of the nozzle 100. When the inner channel 110, the middle channel 120 and the outer channel 130 are all in use, additional mixing occurs inside the mixing volume 152 of the nozzle cap 150. This extra volume provides time and space to form a "united" stream that flows out of the exit opening 154 of the nozzle 100. A higher gas temperature, caused by the flows coming out of the inner channel 110, the middle channel 120 and the outer channel 130 being circulated inside the mixing volume 152 and being exposed to the pointed tip 142 of the high voltage electrode 140 and thus heated thereby, may also explain the better contrast in the second image of the two right images in comparison to the second image of the two left images.

Figure 3A:
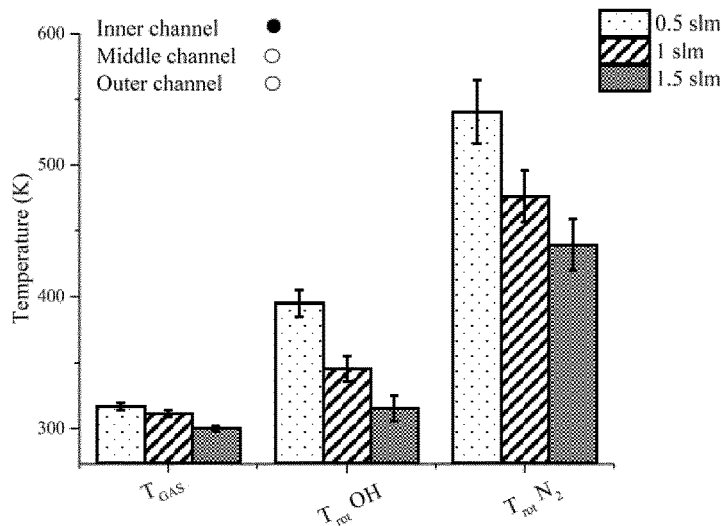
FIG. 3A shows a bar chart of the temperature of a plasma jet generated by a device according to an embodiment of the present invention with only the inner channel activated, and for different flow rates in the inner channel.
Figure 3B:
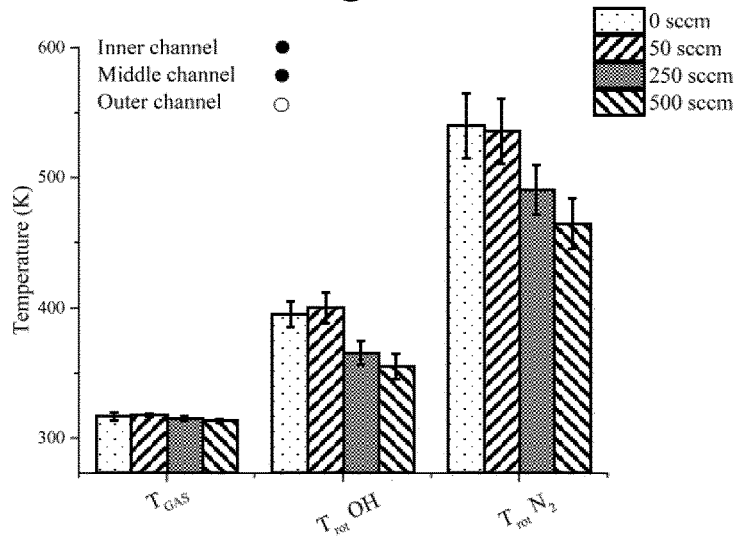
FIG. 3B shows a bar chart of the temperature of a plasma jet generated by a device according to an embodiment of the present invention with the inner and middle channel activated, and for different flow rates in the middle channel.
Figure 3C:
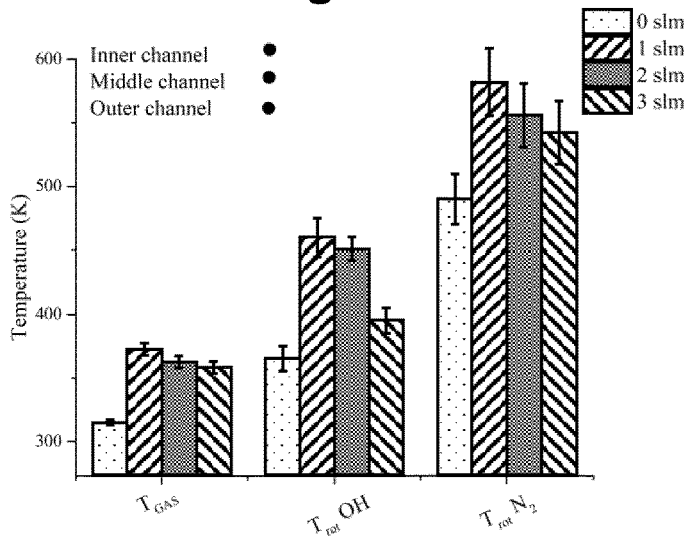
FIG. 3C shows a bar chart of the temperature of a plasma jet generated by a device according to an embodiment of the present invention with inner, middle and outer channel activated, and for different flow rates in the outer channel.
Figure 4:
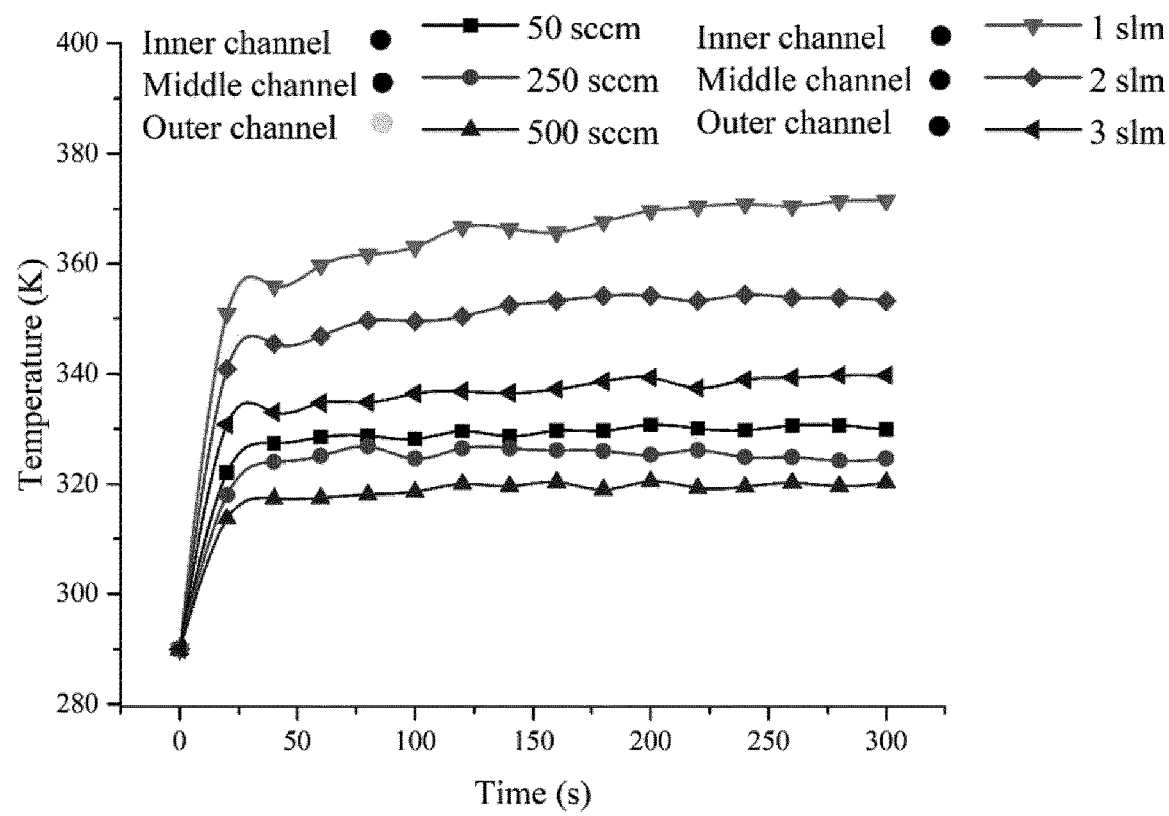
FIG. 4 shows a graph of the surface temperature of a substrate exposed to a plasma jet generated by means of a device according to an embodiment of the present invention with the inner and middle channel activated for different flow rates in the middle channel, and with the inner, middle and outer channel activated for different flow rates in the outer channel.

The aforementioned increase in temperature of the plasma jet due to the flows coming out of the inner channel 110, the middle channel 120 and the outer channel 130 being circulated inside the mixing volume 152 of the nozzle 100, is also demonstrated by means of the experiments of FIGS. 3A-C and the experiment of FIG. 4.

FIG. 3A-C show the temperature, i.e. the gas temperature TGAS, the rotational temperature estimated for OH, Trot OH, and the rotational temperature estimated for N2, Trot N2, of the plasma jet coming out of the exit opening 154 of the nozzle 100, measured by means of Rayleigh scattering of a laser beam pointed through the plasma jet. For these experiments a device was used with a nozzle 100 of which the mixing volume 152 has a circular exit opening 154 with a diameter of 4.5 mm. For the first experiment of FIG. 3A, only the inner channel 110 was active with flow rates of Ar of 0.5 slm, 1 slm and 1.5 slm. For the second experiment of FIG. 3B, the middle channel 120 was also activated with flow rates of Ar of 0 sccm, 50 sccm, 250 sccm and 500 sccm, and this in addition to the inner channel 110 having a flow rate of Ar of 0.5 slm. Here, for demonstration purposes Ar was used in the middle channel 120, although it is not a monomer precursor. For the third experiment of FIG. 3C, the outer channel 130 was also activated with flow rates of Ar of 0 slm, 1 slm, 2 slm and 3 slm, and this in addition to the inner channel 110 having a flow rate of Ar of 0.5 slm and the middle channel 120 having a flow rate of Ar of 250 sccm.

FIGS. 3A-C show that increasing the flow rate in any one of the inner channel 110, the middle channel 120 and the outer channel 130 causes a decrease in temperature of the plasma jet. As can be seen in FIG. 3B, adding Ar gas to the middle channel 120, while keeping a 0.5 slm flow rate of Ar in the inner channel 110, does not change the temperature significantly due to small flow rates. As can be seen in FIG. 3C, the highest temperatures are obtained when the inner channel 110, the middle channel 120 and the outer channel 130 are all in use. This outcome is explained by a prolonged stay of the flows coming out of the inner channel 110, the middle channel 120 and the outer channel 130 inside the mixing volume 152 of the nozzle cap 150, due to said flows being circulated for a while inside the mixing volume 152.

FIG. 4 shows the surface temperature of a substrate exposed to a plasma jet generated by means of a device according to an embodiment of the present invention, wherein the surface temperature was measured by means of an infrared camera and at the centre of the exposed area. For this experiment a device was used with a nozzle 100 of which the mixing volume 152 has a circular exit opening 154 with a diameter of 4.5 mm. For a first series of measurements, the inner channel 110 was active with an Ar flow rate of 0.5 slm and the middle channel 120 with flow rates of Ar and styrene of 50 sccm (■), 250 sccm (●) and 500 sccm (▲). For a second series of measurements, the outer channel 130 was also activated with flow rates of Ar of 1 slm (▼), 2 slm) (♦) and 3 slm (◄), and this in addition to the inner channel 110 having a flow rate of Ar of 0.5 slm and the middle channel 120 having a flow rate of Ar and styrene of 250 sccm.

FIG. 4 shows that increasing the flow rates results in a lower temperature of the substrate at all experimental conditions. The flow rate of Ar and styrene in the middle channel does not significantly influence the substrate temperature. Significantly higher substrate temperatures were observed when the inner channel 110, the middle channel 120 and the outer channel 130 were all in use. This is due to the gas dynamic inside the mixing volume 152 of the nozzle cap 150, which causes the flows coming out of the inner channel 110, the middle channel 120 and the outer channel 130 being exposed to the pointed tip 142 of the high voltage electrode 140 for longer and thus heated thereby.

Figure 5:
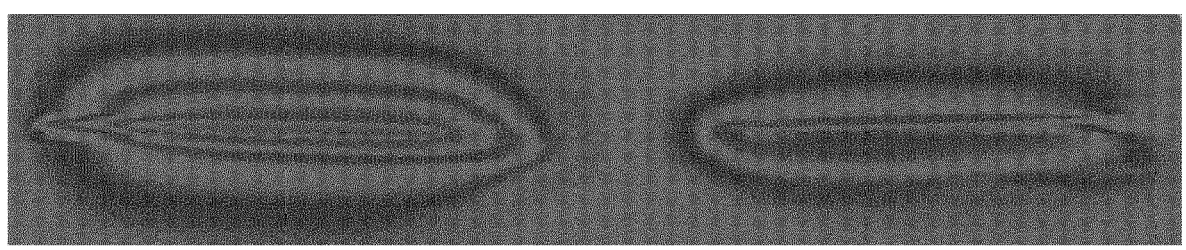
FIG. 5 shows a picture of a plasma polymerised coating on a substrate applied by means of a device according to an embodiment of the present invention with the inner and middle channel activated (right), and with the inner, middle and outer channel activated (left).
Figure 6A:
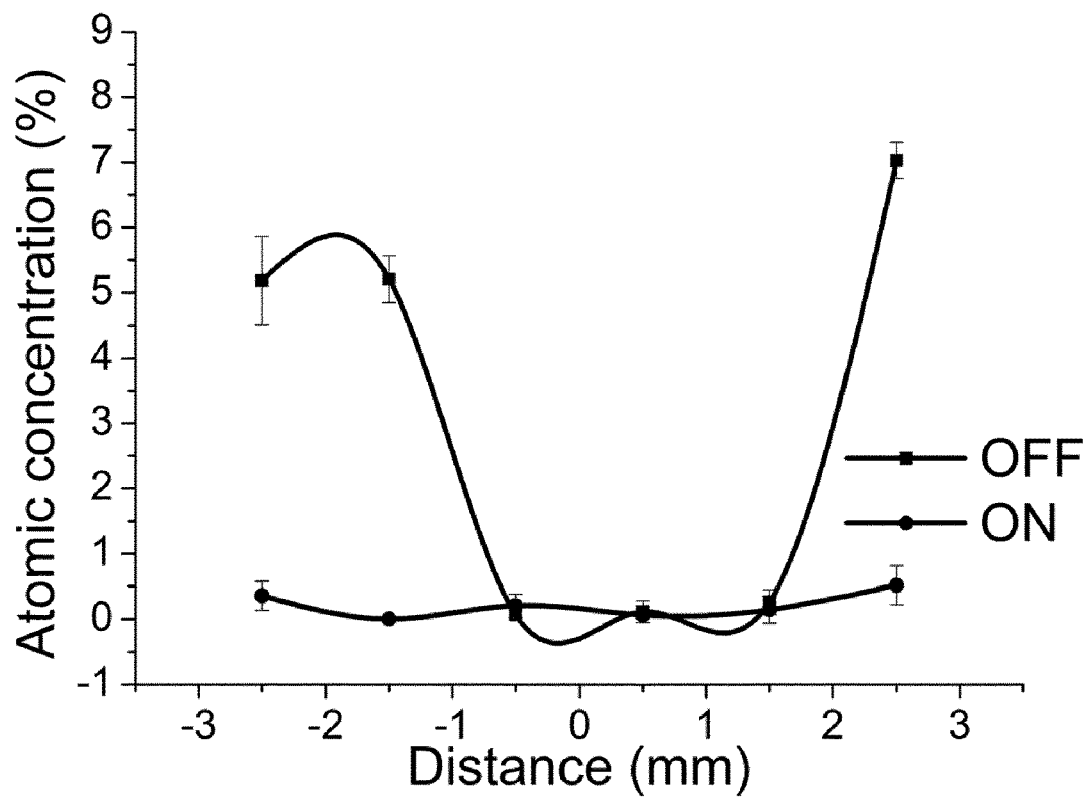
FIG. 6A shows a graph of the atomic concentration of a substrate detectable through a plasma polymerised coating applied by means of a device according to an embodiment of the present invention with the outer channel activated (ON) and with the outer channel not activated (OFF).
Figure 6B:
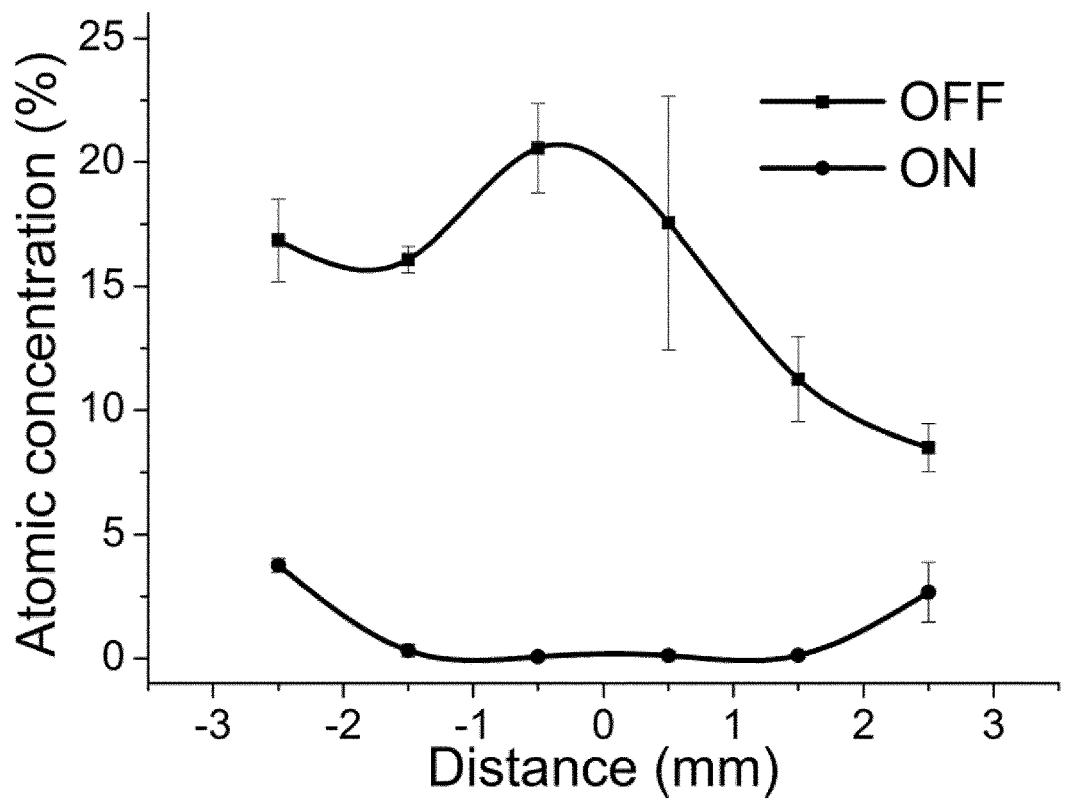
FIG. 6B shows the same graph as FIG. 6A, but after the substrate with the plasma polymerised coating has been submerged for 24 hours underwater.

The uniform distribution of the monomer precursor in the plasma jet is demonstrated by means of the experiment of FIG. 5 and the experiments of FIGS. 6A and 6B.

FIG. 5 shows a picture of a plasma polymerised coating on a silicon substrate applied by means of a device according to an embodiment of the present invention. For this experiment a device was used with a nozzle 100 of which the mixing volume 152 has a circular exit opening 154 with a diameter of 4.5 mm. The coating was deposited on the substrate by moving the plasma jet backwards and forwards along a straight line above the substrate. The deposition speed was 2 mm/s, the deposition duration was 5 min and the moving distance was 30 mm. For a first experiment, of which the results are shown on the right, the inner channel 110 was active with a flow rate of Ar of 0.5 slm and the middle channel 120 with a flow rate of Ar and styrene of 250 sccm. For a second experiment, of which the results are shown on the left, the outer channel 130 was also activated with a flow rate of Ar of 2 slm, and this in addition to the inner channel 110 having a flow rate of Ar of 0.5 slm and the middle channel 120 having a flow rate of Ar and styrene of 250 sccm.

FIG. 5 shows that the coating deposited without employing the outer channel 130, as can be seen on the right, is narrow due to the styrene monomer precursor in the plasma jet being located close to the centre of the plasma jet. The coating deposited with the inner channel 110, the middle channel 120 and the outer channel 130 all active, as can be seen on the left, is more spread out and thus wider, due to the styrene monomer precursor being more uniformly distributed in the plasma jet.

FIG. 6A shows the atomic concentration of a silicon substrate, i.e. the surface silicon concentration of the silicon substrate, detectable through a plasma polymerised coating applied by means of a device according to an embodiment of the present invention, wherein the atomic concentration was measured by means of X-ray photoelectron spectroscopy, XPS, along the width of the coating. For this experiment a device was used with a nozzle 100 of which the mixing volume 152 has a circular exit opening 154 with a diameter of 4.5 mm. The coating was deposited on the substrate by moving the plasma jet backwards and forwards along a straight line above the substrate. The deposition speed was 2 mm/s, the deposition duration was 5 min and the moving distance was 30 mm. For a first measurement (■), the inner channel 110 was active with a flow rate of Ar of 0.5 slm, the middle channel 120 with a flow rate of Ar and styrene of 250 sccm, and the outer channel 130 was not active (OFF). For a second measurement (●), the outer channel 130 was also activated (ON) with a flow rate of Ar of 2 slm, and this in addition to the inner channel 110 having a flow rate of Ar of 0.5 slm and the middle channel 120 having a flow rate of Ar and styrene of 250 sccm.

FIG. 6A shows that the coating deposited with the inner channel 110, the middle channel 120 and the outer channel 130 all active, fully covers the silicon substrate over the entire width of the coating, due to the styrene monomer precursor being uniformly distributed in the plasma jet. The coating deposited without employing the outer channel 130, on the other hand, only fully covers the silicon substrate in a smaller range, due to the styrene monomer precursor in the plasma jet being located close to the centre of the plasma jet.

FIG. 6B shows for the coated silicon substrate of the experiment of FIG. 6A, the atomic concentration of the silicon substrate, i.e. the surface silicon concentration of the silicon substrate, detectable through the plasma polymerised coating, but now after the coated silicon substrate has been submerged in water for a period of 24 hours.

FIG. 6B shows that the coating deposited with the inner channel 110, the middle channel 120 and the outer channel 130 all active, is more stable after having been submerged in water in comparison to the coating deposited without employing the outer channel 130, which is a further advantage of the device according to the present invention.

| References | |
|---|---|
| 100 | nozzle |
| 102 | upper portion |
| 103 | outer wall |
| 104 | external screw thread |
| 106 | lower portion |
| 107 | outer wall |
| 110 | inner channel |
| 112 | first quartz capillary |
| 114 | exit opening |
| 120 | middle channel |
| 122 | second quartz capillary |
| 124 | exit opening |
| 130 | outer channel |
| 134 | exit opening |
| 140 | high voltage electrode |
| 142 | pointed tip |
| 150 | nozzle cap |
| 152 | mixing volume |
| 153 | inner wall |
| 154 | exit opening |
| 156 | upper portion |
| 157 | internal screw thread |
| 158 | lower portion |
| L | longitudinal direction |

The invention claimed is:

1. A device for generating a plasma jet, wherein a nozzle of the device comprises:
   an inner channel, wherein the device is configured for flowing a first ignitable gas through the inner channel towards an exit opening of the inner channel, wherein a high voltage electrode is arranged in the inner channel for generating a plasma from the first ignitable gas flowing in the inner channel;
   a middle channel, wherein the middle channel surrounds the inner channel, wherein the middle channel is electrically insulated from the inner channel, wherein the device is configured for flowing a monomer precursor through the middle channel towards an exit opening of the middle channel;
   an outer channel, wherein the outer channel surrounds the middle channel, wherein the outer channel is electrically insulated from the middle channel, wherein the device is configured for flowing a second ignitable gas through the outer channel towards an exit opening of the outer channel; and
   a nozzle cap, wherein the nozzle cap encloses a mixing volume located after the exit openings of the inner channel, the middle channel and the outer channel, and wherein the nozzle cap is provided with an exit opening after the mixing volume, wherein the exit opening of the nozzle cap is smaller than the exit opening of the outer channel.

2. The device according to claim 1, wherein the mixing volume is adapted for mixing the plasma of the first ignitable gas from the inner channel, the monomer precursor from the middle channel and the second ignitable gas from the outer channel.

3. The device according to claim 1, wherein the mixing volume is located within the nozzle cap.

4. The device according to claim 1, wherein an inner wall of the nozzle cap encloses the mixing volume.

5. The device according to claim 1, wherein the mixing volume is located directly after the exit openings of the inner channel, the middle channel and the outer channel.

6. The device according to claim 1, wherein the exit opening of the nozzle cap is located directly after the mixing volume.

7. The device according to claim 1, wherein the mixing volume extends from the exit openings of the inner channel, the middle channel and the outer channel to the exit opening of the nozzle cap.

8. The device according to claim 1, wherein the exit opening of the nozzle cap is smaller than or equal to the exit opening of the middle channel.

9. The device according to claim 1, wherein an inner wall of the nozzle cap is shaped for gradually guiding a flow of the second ignitable gas in the mixing volume from the exit opening of the outer channel towards the exit opening of the nozzle cap.

10. The device according to claim 9, wherein the inner wall of the nozzle cap is funnel shaped.

11. The device according to claim 1, wherein the nozzle cap is arranged for being removably connected to the nozzle of the device.

12. The device according to claim 1, wherein the device is configured for flowing the first ignitable gas at a predetermined first flow rate through the inner channel towards the exit opening of the inner channel, wherein a first flow rate is at least 0.1 slm, preferably at least 0.2 slm, more preferably at least 0.3 slm, even more preferably at least 0.4 slm, and/or at most 0.9 slm, preferably at most 0.8 slm, more preferably at most 0.7 slm, even more preferably at most 0.6 slm, and most preferably 0.5 slm.

13. The device according to claim 1, wherein the device is configured for flowing the monomer precursor at a predetermined second flow rate through the middle channel towards the exit opening of the middle channel, wherein a second flow rate is at least 50 sccm, preferably at least 100 sccm, more preferably at least 150 sccm, even more preferably at least 200 sccm, and/or at most 650 sccm, preferably at most 550 sccm, more preferably at most 450 sccm, even more preferably at most 350 sccm, and most preferably 250 sccm.

14. The device according to claim 1, wherein the device is configured for flowing a carbon based monomer precursor through the middle channel towards the exit opening of the middle channel.

15. The device according to claim 1, wherein the device is configured for flowing the second ignitable gas at a predetermined third flow rate through the outer channel towards the exit opening of the outer channel, wherein a third flow rate is at least 0.2 slm, preferably at least 0.4 slm, more preferably at least 0.6 slm, even more preferably at least 0.8 slm, and/or at most 5 slm, preferably at most 4 slm, more preferably at most 3 slm, even more preferably at most 2 slm, and most preferably 1 slm.

16. The device according to claim 1, wherein the exit opening of the nozzle cap has a diameter of at least 0.5 mm, preferably at least 1 mm, more preferably at least 1.5 mm, even more preferably at least 2 mm, and/or at most 9 mm, preferably at most 8 mm, more preferably at most 7 mm, even more preferably at most 6 mm.

17. The device according to claim 1, wherein the exit opening of the nozzle cap is adjustable in size.

18. A method for generating a plasma jet, wherein the method comprises the steps of:
flowing a first ignitable gas through an inner channel towards an exit opening of the inner channel, and generating a plasma from the first ignitable gas flowing in the inner channel by a high voltage electrode arranged in the inner channel;
flowing a monomer precursor through a middle channel towards an exit opening of the middle channel, wherein the middle channel surrounds the inner channel, and wherein the middle channel is electrically insulated from the inner channel; and
flowing a second ignitable gas through an outer channel towards an exit opening of the outer channel, wherein the outer channel surrounds the middle channel, wherein the outer channel is electrically insulated from the middle channel;
mixing the plasma of the first ignitable gas, the monomer precursor and the second ignitable gas in a mixing volume of a nozzle cap located after the exit openings of the inner channel, the middle channel and the outer channel; and
ejecting the mixture of the plasma of the first ignitable gas, the monomer precursor and the second ignitable gas in the mixing volume out of an exit opening of the nozzle cap located after the mixing volume, wherein the exit opening of the nozzle cap is smaller than the exit opening of the outer channel.

19. The method according to claim 18, wherein the first ignitable gas is flowed at a predetermined first flow rate through the inner channel towards the exit opening of the inner channel, wherein a first flow rate is at least 0.1 slm, preferably at least 0.2 slm, more preferably at least 0.3 slm, even more preferably at least 0.4 slm, and/or at most 0.9 slm, preferably at most 0.8 slm, more preferably at most 0.7 slm, even more preferably at most 0.6 slm, and most preferably 0.5 slm.

20. The method according to claim 18, wherein the monomer precursor is flowed at a predetermined second flow rate through the middle channel towards the exit opening of the middle channel, wherein a second flow rate is at least 50 sccm, preferably at least 100 sccm, more preferably at least 150 sccm, even more preferably at least 200 sccm, and/or at most 650 sccm, preferably at most 550 sccm, more preferably at most 450 sccm, even more preferably at most 350 sccm, and most preferably 250 sccm.

21. The method according to claim 18, wherein the second ignitable gas is flowed at a predetermined third flow rate through the outer channel towards the exit opening of the outer channel, wherein a third flow rate is at least 0.2 slm, preferably at least 0.4 slm, more preferably at least 0.6 slm, even more preferably at least 0.8 slm, and/or at most 5 slm, preferably at most 4 slm, more preferably at most 3 slm, even more preferably at most 2 slm, and most preferably 1 slm.

22. The method according to claim 18, wherein the method is performed by a device for generating a plasma jet, wherein a nozzle of the device comprises:
an inner channel, wherein the device is configured for flowing a first ignitable gas through the inner channel towards an exit opening of the inner channel, wherein a high voltage electrode is arranged in the inner channel for generating a plasma from the first ignitable gas flowing in the inner channel;
a middle channel, wherein the middle channel surrounds the inner channel, wherein the middle channel is electrically insulated from the inner channel, wherein the device is configured for flowing a monomer precursor through the middle channel towards an exit opening of the middle channel;

an outer channel, wherein the outer channel surrounds the middle channel, wherein the outer channel is electrically insulated from the middle channel, wherein the device is configured for flowing a second ignitable gas through the outer channel towards an exit opening of the outer channel; and a nozzle cap, wherein the nozzle cap encloses a mixing volume located after the exit openings of the inner channel, the middle channel and the outer channel, and wherein the nozzle cap is provided with an exit opening after the mixing volume, wherein the exit opening of the nozzle cap is smaller than the exit opening of the outer channel.

\* \* \* \* \*